United States Patent [19]
Huang et al.

[11] Patent Number: 5,870,049
[45] Date of Patent: Feb. 9, 1999

[54] CURRENT MODE DIGITAL TO ANALOG CONVERTER

[75] Inventors: Chaogang Huang, Nepean; Bruce Millar, Stittsville; Claude Chouinard, Hull, all of Canada

[73] Assignee: MOSAID Technologies Incorporated, Kanata, Canada

[21] Appl. No.: 838,168

[22] Filed: Apr. 16, 1997

[51] Int. Cl.$^6$ ................................................ H03M 1/66
[52] U.S. Cl. ................................................ 341/144
[58] Field of Search ........................ 341/144, 120, 341/126, 154, 118

[56] References Cited

U.S. PATENT DOCUMENTS

| | | | |
|---|---|---|---|
| 4,542,368 | 9/1985 | Lillis | 341/120 |
| 5,327,390 | 7/1994 | Takasugi | 365/230 |
| 5,469,386 | 11/1995 | Obara | 365/189.07 |

*Primary Examiner*—Brian Young
*Attorney, Agent, or Firm*—Neil Teitelbaum & Associates

[57] ABSTRACT

A current mode digital-to-analog converter (DAC) consisting of a bias generator, a current mode scale-down section and a current mode scale-up section is presented which converts an n-bit digital input into an analog output. The bias generator ensures a constant reference current is caused to flow into both scale-down and scale-up sections of the DAC. The scale-down section uses the m lower-order bits of the n-bit digital input to generate a combined fractional current based on the reference current. The (n–m) higher-order bits of the n-bit digital input are used by the scale-up section to generate a multi-unit current based on the reference current. The fractional and multi-unit currents are simultaneously added together onto the output node to generate the desired analog output. By separating the total number of bits to be converted into a scale-down and a scale-up section, the total number of transistors is substantially decreased compared to other current mode DAC designs which typically use scale-up techniques only. The DAC circuit presented is fast, robust, and is capable of being implemented substantially in P type transistors reducing layout complexity.

28 Claims, 3 Drawing Sheets

CURRENT MODE DIGITAL TO ANALOG CONVERTER

FIELD OF THE INVENTION

This invention relates generally to digital to analog (DAC) circuits and more particularly to an improved current mode DAC provided with a scale-up component and a scale-down component for the higher and lower order bits of the digital input, respectively.

1. Background of the Invention

DACs are well known electronic components and have found numerous uses in all forms of digital circuitry. A typical DAC is based on the concept of segmenting an analog range into a set of discrete steps each of which is selected in response to a predetermined digital input combination. The typical DAC receives a multi-bit digital input signal and converts the digital input signal into an analog output signal by mapping the digital input signal onto an associated discrete analog value. DACs are used in voice communication, modems, CD audio systems, digital audio and video applications, video display technologies, control systems, etc. Essentially, any application that requires an analog input within a predominantly digital system will require the use of a DAC. One important application of DACs is integrated circuit (IC) testing environments, which often require a range of voltage and current values for testing pins of ICs. In a test system, a preferred approach is to provide certain test parameters and instructions to an electronic tester and have the tester generate all necessary test conditions, including a wide range of test voltages. A DAC provides an ideal solution for implementing this requirement in an IC.

2. Prior Art

Among prior art DAC designs, current mode DACs are very fast and accurate. For low resolution analog output generation, high speed current mode DACs are near ideal; however, high speed current mode DACs, require very large numbers of transistors for implementing high resolutions. Essentially, in order to increase a reference current, for example, many transistors are connected in parallel to effectively multiply the reference current to a larger value. For 4 bit DACs this results in about 30 transistors as well as associated circuitry. In contrast, when 12 bits of resolution are required, about 12288 transistors and associated circuitry are required for a prior art current mode scale-up DAC implementation.

Two main problems arise in circuits using increased numbers of transistors—an increase in leakage currents and increased mismatching of transistors. Since each current branch of a current mode DAC consists of a desired controlled current component and a leakage current component, the larger the number of transistors and the larger their drive capability, the larger the resulting leakage current component. The leakage current component is highly temperature dependent and therefore greatly affects DAC performance. A larger circuit area covered by transistors which function interdependently, as in a current mode DAC, increases risk of layout and temperature mismatching. It is evident to those of skill in the art that mismatching of transistors, affects accuracy and performance. These problems are further augmented in systems requiring a number of DACs. There is therefore, a significant need for an efficient fast DAC that is designed with fewer transistors than those of the prior art.

In general, conventional current mode DACs generate a reference current using a bias generator and then effectively scale-up the magnitude of that reference current in various increments, determined by the number of digital inputs provided to the DAC, using current sources with the individual transistor sizes scaled according to a binary-weighted sequence. As increased numbers of resolution bit are necessary, however, the total number of transistors required for implementing the resolution becomes prohibitive. Physically the reference current is not multiplied but through variations in transistor dimensions or alternatively by disposing transistors in parallel to act as a single larger transistor, current scaling-up is accomplished.

Various approaches for reducing the number of transistors required for implementation of a DAC have been proposed. Some proposed circuits divide the digital bits received by a DAC into high order bits and low order bits. Park discloses one such DAC in U.S. Pat. No. 5,568,146. Park discloses a digital/analog converter comprising coarse decoding means for decoding the higher M bits and fine decoding means for decoding the lower N bits of an M+N bit digital input signal. The coarse decoding means comprises current scaling means implemented as controllable current sources. The current scaling means are for classifying currents into a plurality of steps and providing one of the classified currents in response to the M high order bits to a current-to-voltage converter. A current-to-voltage converter converts the received current from the current scaling means into a first reference voltage. A voltage elevator is used to provide a second reference voltage to a voltage divider. The second reference voltage has a relative voltage to the first reference voltage of one coarse voltage step. The reference voltages are provided to top and bottom terminals of the fine decoding means. The fine decoding means comprises a standard DAC architecture resistive network and selecting switches for dividing the difference between the reference voltages into a plurality of steps. In dependence upon the N bits, one of the steps is switched for output from the fine bit decoding means.

Due to an inaccurate coarse bit step resulting from common process deviations, a current compensating means for maintaining the reference voltage constant is introduced to compensate for discrepancies in the first and second reference voltages. Without this current compensator, improper conversion in the coarse decoding means can result.

The system disclosed by Park reduces the overall number of transistors required for a traditional resistive network type DAC; however, the use of a current-to-voltage converter, a voltage elevator and a current compensator, results in added complexity and may result in errors in analog output voltage. Furthermore, this approach uses a combination of current and voltage conversion techniques which together are slower than a prior art current mode DAC. A less complex current mode DAC using, a reduced number of transistors is, therefore, preferable.

A further example of a circuit which divides the digital bits presented to a DAC into high order bits and low order bits is disclosed by Hull et al. in U.S. Pat. No. 5,017,919. In that patent, a DAC is implemented using a first scale-up DAC for the low order bits and a second scale-up DAC for the high order bits. The DAC generates a first bias voltage, which biases the first set of current sources to each produce a unit magnitude current. A first decoder determines whether each of the unit magnitude currents are added to the analog output or added to a summing node for generating a second bias voltage. The second bias voltage biases a second set of current sources, each producing a multi-unit magnitude current that is selectively added to the analog output by a second decoder. All of the DAC circuitry is level-shifted up to 12V $V_{cc}$ from the rest of the disclosed system that operates at standard $V_{DD}$ level of 5V. The level shifting to the 12V range makes the overall system more robust in terms of the conversion range. Effectively, more conversion range translates into higher accuracy for the analog output. However, such a high voltage may not be readily available nor easily produced on an IC within a system. Many systems require a DAC to function within the $V_{DD}$ range of the digital inputs. Furthermore, the use of two bias voltage generators increases the potential for error in the resulting analog output signal.

It would therefore be advantageous to provide a current mode DAC using fewer transistors than are used in conventional current mode DACs that relies on a single current source which is stable in the face of temperature and process variations and which operates solely with $V_{DD}$-level digital inputs.

OBJECT OF THE INVENTION

In an attempt to overcome these and other limitations of the prior art, it is an object of the present invention to provide a current mode DAC using fewer transistors than are used in conventional current mode DACs It is another object of the present invention to provide a current mode DAC that is not substantially susceptible to process variation discrepancies.

It is another object of the present invention to provide a current mode DAC that relies on a single reference current.

STATEMENT OF THE INVENTION

In accordance with the invention there is provided a digital-to-analog converter for converting an n-bit digital signal into an analog output signal. The digital-to-analog converter comprises an output node;

bias generating means for generating a bias voltage for causing a reference current to flow;

means for scaling-down the reference current in response m lower-order bits of the n-bit digital signal, and for providing a combined fractional current to the output node wherein n and m are integers; and, means for scaling-up the reference current in response to n minus m higher-order bits of the n-bit digital signal, and for providing a combined multi-unit current to the output node, wherein the combined fractional current and the combined multi-unit current combine to form an analog output signal.

In an embodiment, the means for scaling-down the reference current comprises: a ground terminal;

a first means for causing the reference current to flow in response to the bias voltage;

a first plurality of pairs of switching means coupled in parallel, a switching means from a pair coupled between the first means for causing the reference current to flow and the output node and another switching means from a pair between the first means for causing the reference current to flow and the ground terminal; the first plurality of pairs of switching means controlled by m lower-order bits of the n-bit digital input and their complements, wherein each of the first plurality of pairs of switching means selectively directs a fraction of the reference current to one of the output node and the ground terminal.

In an embodiment, the means for scaling-up the reference current comprises:

a plurality of means for multiplying the reference current in response to the bias voltage;

a second plurality of pairs of switching means, a switching means from a pair coupled between the plurality of means for multiplying the reference current and the output node and another switching means from a pair coupled between the plurality of means for multiplying the reference current and the ground terminal, the second plurality of pairs of switching means controlled by n-m higher-order bits of the n-bit digital input and their complements;

wherein each of the second plurality of pairs of switching means selectively directs multi-unit current components of the reference current to one of the output node and the ground terminal.

In accordance with the invention there is provided a digital to analog converter comprising:

an input port for receiving an n-bit digital input signal;

an output terminal;

a current terminal for receiving a reference current; and, a current mode scale-down means for receiving and dividing the reference current into a plurality of fractional current components, for receiving a signal in dependence upon the n-bit digital input signal, and for providing a number of the fractional current components to the output terminal in dependence upon the received signal, wherein fractional current components provided to the output terminal combine to form an analog output signal.

In an embodiment, the DAC also comprises a current mode scale-up means for receiving some of the n-bit digital input signal and for receiving current from the power supply terminal and for providing multiple-current components to the output terminal in dependence upon the some of the n-bit digital input signal, each of the multiple-current components being a multiple of the reference current, whereby the fractional current components and multiple-current components combine to form an analog output signal.

In an embodiment, the current mode scale-down means for receiving and dividing the reference current into a plurality of fractional current components, for receiving a signal in dependence upon the n-bit digital input signal, and for providing a number of the fractional current components to the output terminal in dependence upon the n-bit digital input signal, is for dividing the reference current into $2^n$ equal fractional current components, providing one fractional current component to the second terminal, and in dependence upon a value of a bit from the n-bit digital input signal where the bit has a bit location L from 0 . . . (n−1) where n−1 is the highest order bit, providing $2^{(L-1)}$ fractional current components to one of the output terminal and the second terminal.

In accordance with the invention there is provided a digital-to-analog converter for converting a digital signal into an analog signal. The digital-to-analog converter comprises an output port;

a first conductor;

a plurality of other conductors;

a first means for providing a reference current to the first conductor and a plurality of means for providing multiples of the reference current to the plurality of other conductors;

current mode scale-down means coupled to the first conductor for selectively directing a fractional portion of the reference current less than the whole from the first conductor to the output port in dependence upon the digital signal; and, current mode scale-up means coupled to the plurality of other conductors for selectively directing the multiples of the reference current to the output port in dependence upon the digital signal, wherein the fractional portion of the reference current directed to the output port and the multiples of the reference current directed to the output port combine to form an analog output signal.

In accordance with the invention there is provided a digital to analog converter for converting an n-bit digital input signals where n is an integer, into an analog output signal. The DAC comprises a power supply terminal for receiving current;

a first output terminal;
a second output terminal;
a reference current terminal;
plurality of multiple-current terminals;
a biasing means for providing a bias voltage;
a current switch for providing current from the power supply terminal to the reference current terminal in dependence upon the bias voltage;
a plurality of multiple-current switches for providing current in exponential multiples of the reference current from the power supply terminal to the multiple-current terminals in dependence upon the bias voltage;
current scale-down means for receiving m bits, where m is an integer less than n, comprising:
    a plurality of scale-down switching means, each coupled to the first output terminal, the second output terminal, and the reference current terminal and for switching a fraction of the reference current to one of the first output terminal and the second output terminal in dependence upon a bit from the m bits; and,
current scale-up means for receiving n minus m bits comprising:
    a plurality of scale-up switching means, each coupled to a multiple-current path from the plurality of multiple-current paths, the first output terminal and the second output terminal and for switching the current in the multiple-current path to one of the first output terminal and the second output terminal in dependence upon a bit from the n minus m bits.

In accordance with the invention there is further provided a digital-to-analog converter (DAC) for converting an n-bit digital signal into an analog output signal. The DAC comprises a reference current terminal for accepting a generated reference current, a bias generating means for generating a bias voltage which causes the reference current to flow into current converting sections of the DAC. The DAC further includes a current scale-down circuit responding to the m lower-order bits of the n-bit input for outputting a combined fractional current to an output node, and a current scale-up circuit responding to the (n−m) higher-order bits of the n-bit input signal, for outputting a combined multi-unit current and the same output node. The combined fractional current and combined multi-unit current are thereby summed to develop an analog signal output in response to the n-bit digital input.

An advantage of the present invention is a DAC with fewer transistors than conventional current mode DACs that maintains simplicity of design, robustness, and reliability of known current mode DACs.

A further advantage of the present invention is that the effect of leakage current on the analog output signal is reduced.

A further advantage of the present invention is that by reducing the total number of transistors required for implementation of a DAC, the risk and effect of transistor mismatching in a system where the transistors are functionally interdependent is also reduced.

BRIEF DESCRIPTION OF THE DRAWINGS

Exemplary embodiments of the invention will now be described in conjunction with the following drawings, in which.

DETAILED DESCRIPTION

Prior art current mode DAC designs are numerous. As an understanding of current mode DAC design and operation aids in understanding the invention, a brief description of a typical prior art current mode DAC is herein presented.

Figure 1:
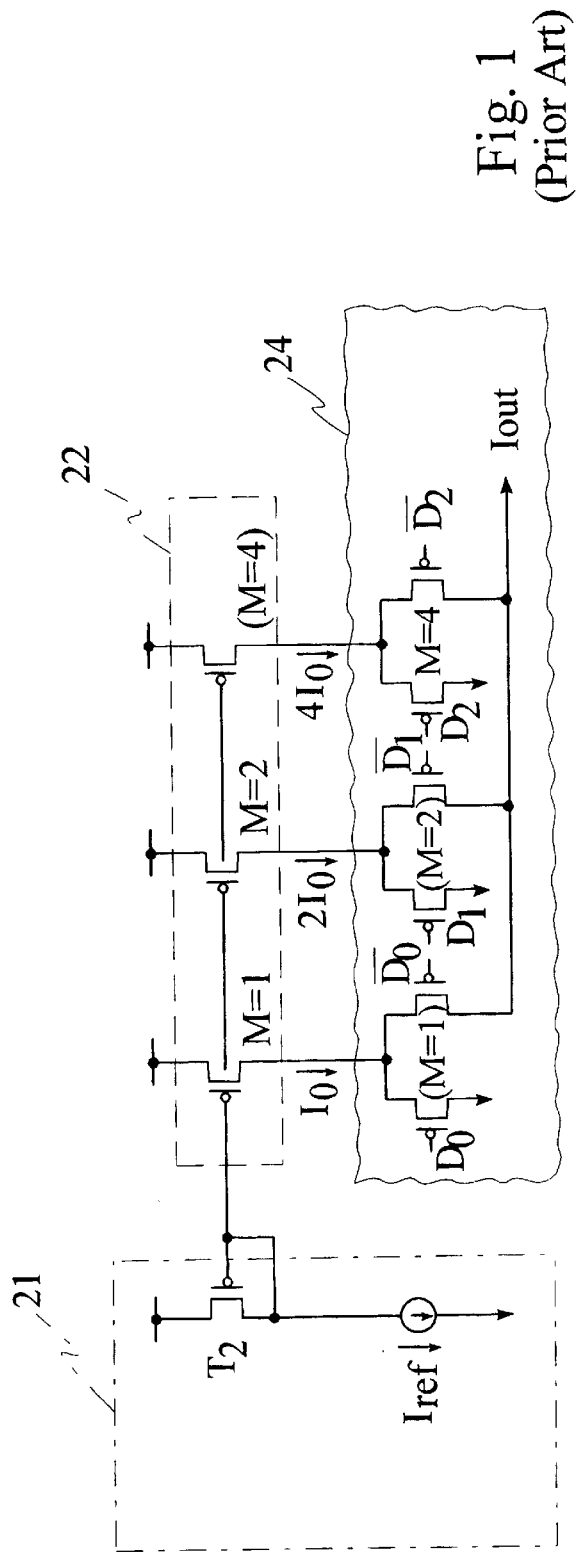
FIG. 1 is a simplified schematic diagram of a prior art current mode scale-up 3-bit DAC.

Referring to FIG. 1, a simplified schematic diagram of a current mode scale-up 3-bit DAC is shown. A reference current generator circuit 21 generates a reference current $I_0$ that is based on the reference current $I_{ref}$ and is effectively mirrored by the connection of transistors T1, T2 and T3. $I_0$ is scaled-up by transistors 22, which when switched on, allow multiples of the current $I_0$ to flow to transistor pairs 24. The M-factor indicated beside the transistors represents the multiplying factor of the current and is physically implemented by connecting M transistors in parallel. The multiple transistors in parallel are not shown in FIG. 1 for simplification of the schematic. Switching transistors 24 are arranged in pairs. Commonly, a plurality of switching transistors disposed in parallel is used for some of the transistors. A transistor of each pair of transistors is gated by a signal determined in dependence upon a digital input bit; the other transistor is gated by a complementary signal. This gating results in current flowing through one transistor from each pair.

Figure 2:
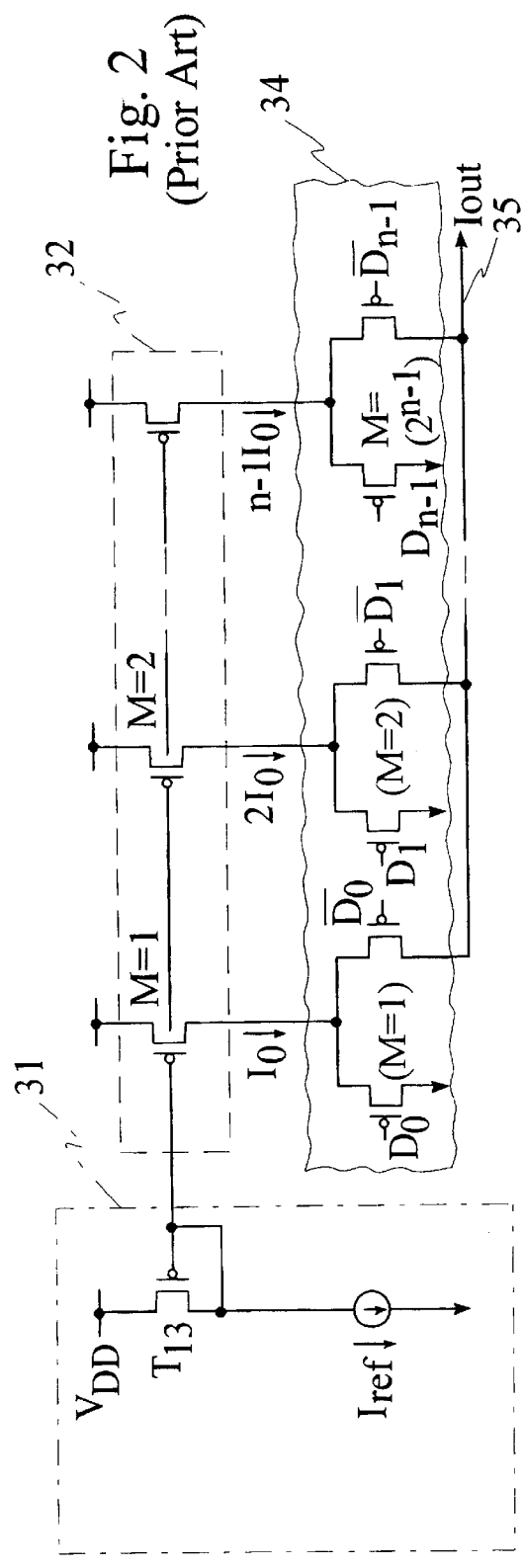
FIG. 2 is a simplified schematic diagram of a prior art current mode scale-up n-bit DAC.

To improve DAC resolution to n-bits requires a substantially larger number of transistors, as shown in FIG. 2, which illustrates an n-bit structure. As a comparison, in the circuit of FIG. 1, more than 21 transistors are used to implement a 3-bit DAC. This number is calculated using the general formula, $$T_n = T_f + 3(2^n - 1)$$

where $T_f$ is the fixed number of transistors in the reference current generator and n is the total number of input bits. Referring to FIG. 2, a reference current generator 31 generates the reference current $I_0$ which is scaled-up by transistors 32. The transistors, when switched on, provide current to transistor pairs 34. The analog output current is provided to node 35. This output current is a sum of each multi unit current component switched to the node 35. As the number of digital input bits increases, the number of current source transistors increases according to $2^n-1$ and the number of transistors forming transistor pairs increases according to $2(2^n-1)$, becoming prohibitively high. For example, a 12-bit DAC requires approximately 12291 transistors according to the above formula with n=12 and $T_f$=6. Clearly, for many applications, the total number of transistors is prohibitive.

Figure 3A:
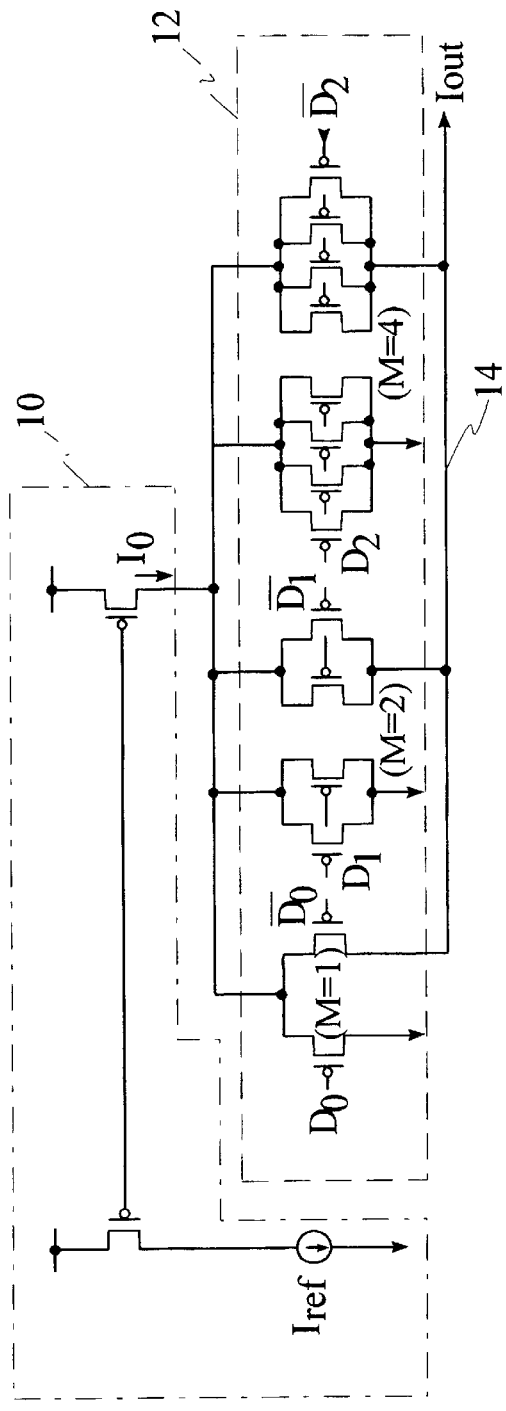
FIG. 3a is a simplified partial schematic diagram of a current mode scale-down section of a 3-bit DAC according to an embodiment of the present invention.

Referring now to FIG. 3a, a simplified schematic diagram illustrating one component of the present invention is presented. A current mode scale-down 3-bit DAC, comprising a single current source 10, provides a current to each of a plurality of transistor pairs 12. Each transistor pair switches current to an output signal 14 or to ground. A first transistor in each transistor pair 12 is driven by a signal related to bit Di from a 3-bit digital input signal provided to the DAC. Another transistor in each transistor pair 12 is driven by a complimentary signal to that driving the first transistor. As a result, 7 of the 14 transistors are on for any digital input signal. When a given bit is '0' current is directed through a transistor to the reference ground and when a given bit is '1' current flows through another transistor in the pair to an output terminal 14. Since current is additive, the output current $I_{out}$ is the sum of all fractional current components switched through another transistor to the output terminal 14. Since a same number of transistors is always in an 'on' state, the current through each 'on' transistor is substantially constant and the current present at the output terminal is a fraction of the reference current related to the state of the digital input signal provided to the DAC and the number of supported analog output levels.

For the 3-bit implementation, 7 pairs—14 transistors—are required in addition to reference current generator transistors that remain constant regardless of the number of resolution bits. Since one possible output signal is 0A or no current, a transistor from each transistor pair conducts a fractional current component 1/7 of the current provided by the current source. In FIG. 3a, transistors connected in parallel for scaling have been explicitly shown, thereby illustrating the concept of the M factor. It is evident to those of skill in the art that a plurality of transistors disposed in parallel with gates provided a same signal and a single transistor having different dimensions perform substantially a same function.

Again, the number of transistors is predictable. The number of transistors required for an n-bit DAC having $T_f$ transistors in the voltage biasing circuit is $T_n = T_f + 1 + 2(2^n - 1)$.

Though this does not eliminate the exponential growth in the number of transistors, as the number of bits increases and when $2^n >> T_f + 1$, the current mode scale-down DAC circuit requires substantially 2/3 as much space in an IC.

Figure 3B:
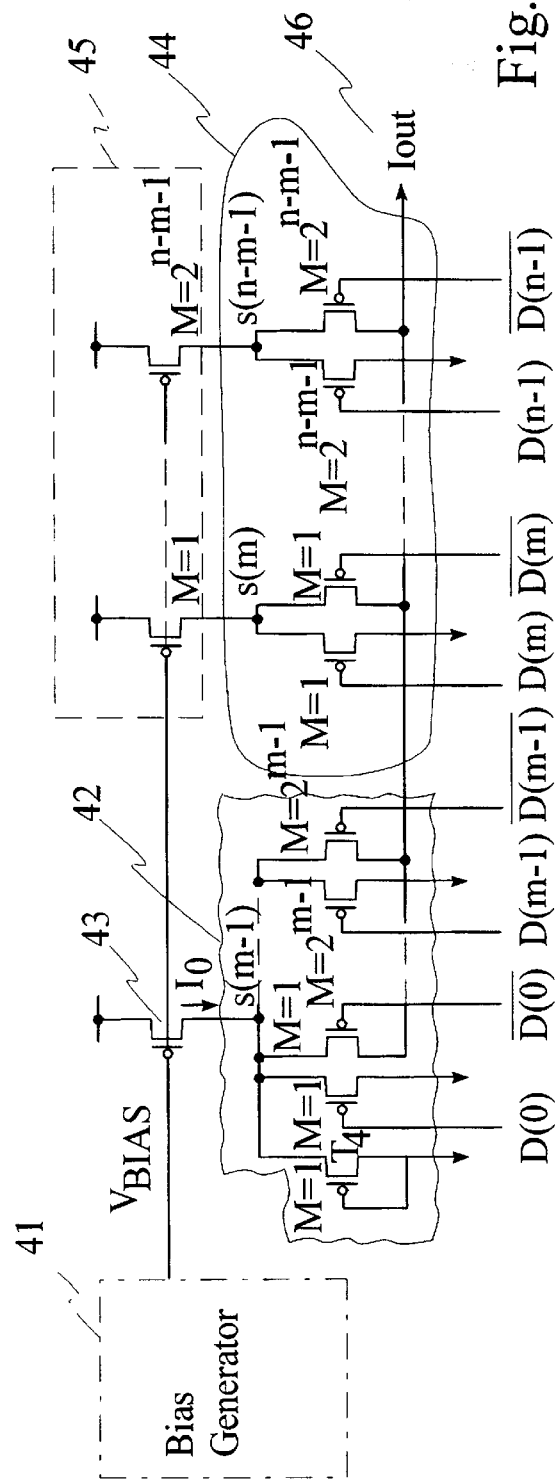
FIG. 3b is a simplified full schematic diagram of a current mode n-bit DAC according to an embodiment of the present invention; and, FIG. 4 is a schematic diagram of a bias generator circuit according an embodiment of the invention.

Referring to FIG. 3b, a simplified schematic diagram of a DAC circuit according to an embodiment of the invention is shown. The DAC is divided into three sections: a bias generator, a lower m bit scale-down section, and the higher n–m bit scale-up section. The total number of bits for digital-to-analog conversion is n. In one embodiment of the present invention, m=4, n–m=8 and n=2. The scale-down section of the DAC consists of a current biasing transistor 43 and transistor pairs 42. Signals associated with the lower order bits D(0)/D(0)~--D(m-1)/D(m-1)~ are provided as inputs to transistors within transistor pairs 42. Signals associated with the higher 8 bits are provided as inputs to a standard scale-up section of the DAC consisting of biasing transistors 45 and transistor pairs 44. Current flowing through transistors from each group of transistor pairs 42 and 44 are either channeled to ground or to the output node 46.

In operation the hybrid scale-up/scale-down DAC of FIG. 3b operates to reduce the number of transistors used in DAC circuit implementation without requiring further reference sources. The scale-down section uses the lower order m bits and splits the reference current $I_0$, into a number of current paths corresponding to the lower m bits. For any binary combination of D(0)/D(0)~--D(m-1)/D(m-1)~, 15 of the 30 transistors from the group 42 will be on. The scale-down section only has $2^{m-1}$ paths. Transistor T4 is diode connected to ground and provides an extra current path. As a result, for any binary combination of D(0)/D(0)~--D(m-1)/D(m-1)~, the fractional current component flowing through any one transistor of each of the transistor pairs 42 will be equal to $1/2^m$ of $I_0$. Where m=4, a fractional current 1/16 of $I_0$ will flow through a transistor from each transistor pair of transistor pairs 42. Depending on the value of the binary bit at each respective bit location, the $M/2^m$ of $I_0$ will either flow to ground or sum with other fractional current components onto the output node 46. In this fashion, the current from the scale-down section of the DAC is a combination of fractional current components of the reference current $I_0$.

Essentially, the diode connection ensures that a fraction of the current is directed to the ground resulting in an output current range of 0 $I_0$ to $(2^m-1)/2^m \, I_0$. This ensures accurate binary quantization steps for the analogue output current.

The higher order n minus m bits are used with scaled-up currents each a multiple of the reference current $I_0$—a multiple-current component. This is accomplished by multiplying the drive capability of transistors 45 and 44 according to the M factor. Preferably, this is accomplished by disposing M parallel transistors each conducting an amount of current substantially equal to the reference current $I_0$. This scale-up operation is performed as described in the prior art and will therefore not be discussed here.

In the present embodiment, all transistors used in both the scale-up and the scale-down sections are PMOS-type transistors. This implementation of the circuit is very simple and stabilizes the design in terms of process variations; only PMOS devices need to be optimized.

Figure 4:
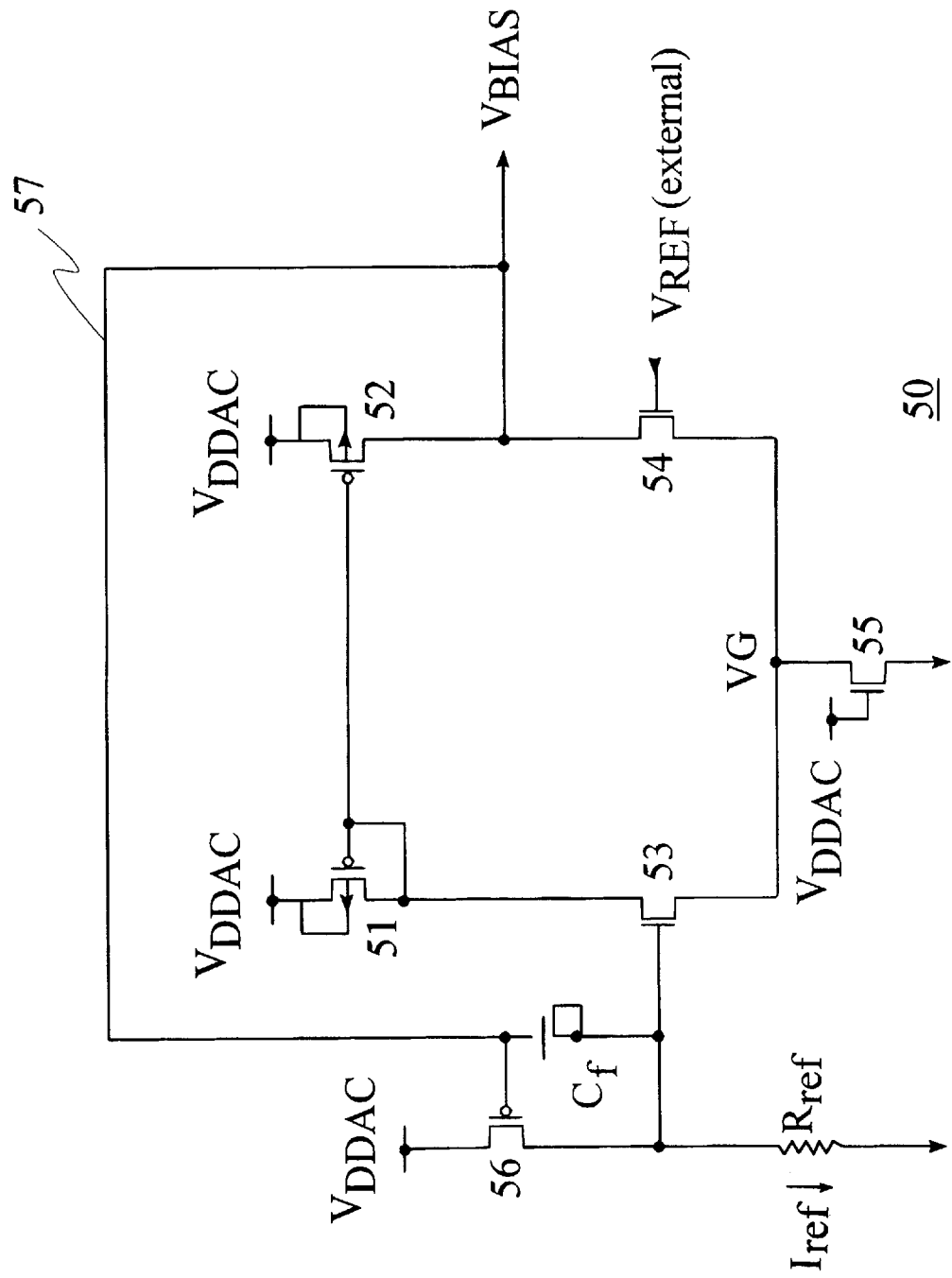

To generate the reference current $I_0$, a circuit as shown in FIG. 4 is used. A bias voltage $V_{BIAS}$ is generated which ensures that a reference current flows through transistor 43 and multiples of that reference current flow through transistors 45. A differential amplifier 50 having a very high gain and using an external substantially constant $V_{REF}$ is used to generate the bias voltage $V_{BIAS}$ which is used to cause the reference current $I_0$ to flow for the DAC. The differential amplifier consists of two NMOS comparing input transistors 53 and 54 as well as PMOS load transistors, 51 and 52. A pull-down path transistor 55 is controlled by VDD. The above mentioned transistors are connected and operate in a well-know fashion commonly employed in differential amplifier design. From the output terminal of the differential amplifier, a feedback signal is provided to the gate of a large current driving transistor 56 as well as to one plate of a stabilizing NMOS feedback capacitor, $C_f$. The other side of the NMOS capacitor is connected to the gate of transistor 53. The gate of transistor 53 is further connected to an external resistor $R_{ref}$, which maintains a substantially constant resistance over temperature and process variations. The use of the external resistor ensures the flow of a constant current based on the output of the differential amplifier. In an alternate embodiment, the resistor is replaced with an external current source which provides a constant flow of current. The result of a circuit according to either embodiment is a bias circuit which tracks changes between VDD and the bias voltage $V_{BIAS}$.

By splitting the total number of bits into two groups, and generating fractional amounts of a reference current in a scale-down DAC section and scaled-up currents in a scale-up DAC section, a reduction in the total number of transistors is achieved compared to an approach where only a scale-up DAC is used to generated the analog output signal. In the embodiment of the invention herein described, the overall result for a 12 bit DAC comprising a 4 bit scale-down section and an 8 bit scale-up section requires $8+2(2^m-1) +3(2^{n-m}-1)$ or 803 transistors. Compared to 12291, this represents a significant reduction over the prior art.

A DAC, according to an embodiment, has several advantages. It incorporates a fast, simple robust circuit. With the exception of some N type transistors in the current source circuit, all the transistors are P type and can be laid out in a single N well. This provides a significant advantage over the prior art; however, it is evident to those of skill in the art that this is an implementation decision and other transistors and layouts can be used.

Some additional considerations in designing a DAC include minimizing power consumption. The maximum current resulting from the DAC will be $I_{max}=(2^{n-1}-1)*I_{min}$, and the power dissipation is given by $I_{max}*V_{DD}$. As a result, in order to reduce power consumption, $I_{min}$ is kept small for proper operation within certain constraints. Preferably, all transistors in the DAC have properly matched W/L dimensions and threshold voltages. It is preferable to select a minimum current, $I_{min}$, that is much larger than the leakage current. The result of an analysis of leakage current and of transistor operation allows the selection of a minimum current, $I_{min}$, for efficient circuit operation. It is clear to those of skill in the art that the minimum current herein described is the current flowing through a transistor from a single transistor pair within the scale-down section of the DAC.

The calculation of $I_{min}$ takes into account the particular schematic for the current mode scale-down DAC portion of the circuit. Likely, $I_{min}$ times $2^m$ will be significantly above the minimum current requirements for the scale-up current mode DAC portion of the circuit, but this should also be verified during design.

Consideration of the optimum number of bits to use in the scale-down section and the scale-up section is also required in conjunction with leakage current and transistor sizing considerations. By selecting n/2 bits for each of the scale-down circuit and the scale-up circuit, a minimum transistor count results. Since a current mode scale-down DAC is sensitive to voltage at its output terminal, it is preferable to decode a smaller number of bits in the scale-down section. In the embodiment discussed above, 4 bits are used for the scale-down section, resulting in a reference current greater than or equal to 16 times $I_{min}$.

The above mentioned additional considerations are presented with respect to an embodiment of the invention. Other standard design techniques used to determine design criteria may be employed without departing from the scope of the invention.

Numerous other embodiments of the scale-up/scale-down DAC concept may be envisaged without departing from the spirit and scope of the invention as specified in the appended claims.

What is claimed is:

1. A digital-to-analog converter for converting an n-bit digital signal into an analog output signal, the digital-to-analog converter comprising:

an output node;

bias generating means for generating a bias voltage for causing a reference current to flow;

means for scaling-down the reference current in response to m lower-order bits of the n-bit digital signal, and for providing a combined fractional current to the output node, wherein n and m are integers, the means for scaling down the reference current inclucing a ground terminal;

a first means for causing the reference current to flow in response to the bias voltage;

a first plurality of pairs of switching means coupled in parallel, a switching means from a pair of switching means coupled between the first means for causing the reference current to flow and the output node and another switching means from the pair of switching means coupled between the first means for causing the reference current to flow and the ground terminal; the first plurality of pairs of switching means being controllable by m lower-order bits of the n-bit digital input and their complements, wherein each of the first plurality of pairs of switching means is for selectively directing a fraction of the reference current to one of the output node and the ground terminal; and, means for scaling-up the reference current in response to n minus m higher-order bits of the n-bit digital signal, and for providing a combined multi-unit current to the output node, wherein the combined fractional current and combined multi-unit current combine to form an analog output signal.

2. A digital to analog converter for converting a digital signal into an analog signal according to claim 1, wherein the means for scaling-up the reference current comprises:

a plurality of means for multiplying the reference current in response to the bias voltage;

a second plurality of pairs of switching means, a switching means from a pair coupled between the plurality of means for multiplying the reference current and the output node and another switching means from the pair coupled between the plurality of means for multiplying the reference current and the ground terminal, the second plurality of pairs of switching means being controllable by n−m higher-order bits of the n-bit digital input and their complements;

wherein each of the second plurality of pairs of switching means is for selectively directing multi-unit current components of the reference current to one of the output node and the ground terminal.

3. A digital to analog converter comprising:

an input port for receiving an n-bit digital input signal;

an output terminal;

a current terminal for receiving a reference current; and, a current mode scale-down means for receiving and dividing the reference current into a plurality of fractional current components, for receiving a signal in dependence upon the n-bit digital input signal, and for providing a number of the fractional current components to the output terminal in dependence upon the received signal, wherein, when current is applied, fractional current components provided to the output terminal combine to form an analog output signal.

4. A digital to analog converter for converting a digital signal into an analog signal according to claim 3 comprising:

a power supply terminal for receiving current;

a bias voltage generator for providing a bias voltage; and, means coupled between the power supply terminal and the current terminal for receiving the bias voltage and for causing a substantially constant current to flow from the power supply terminal to the current terminal in dependence upon the bias voltage.

5. A digital to analog converter for converting a digital signal into an analog signal according to claim 3 comprising:

a second terminal, and wherein the a current mode scale-down means comprise a predetermined number of switched current paths, each switched current path for providing current to one of the output terminal and the second terminal.

6. A digital to analog converter for converting a digital signal into an analog signal according to claim 5 wherein the predetermined number of switched current paths are for conducting a substantially constant current to one of the output terminal and the second terminal.

7. A digital to analog converter for converting a digital signal into an analog signal according to claim 5 wherein the switched current paths comprise:

a first transistor coupled between the current terminal and the output terminal, the first transistor for receiving a first control signal in dependence upon a bit from the n-bit digital input signal; and, a second transistor coupled between the current source and the second terminal, the second transistor for receiving a second control signal complimentary to the first control signal.

8. A digital to analog converter for converting a digital signal into an analog signal according to claim 5 wherein the switched current paths comprise:

a first transistor having a source coupled to the current terminal, a drain coupled to the output terminal, and a gate coupled to receive a first control signal in dependence upon a bit from the n-bit digital input signal; and, a second transistor having a source coupled to the current terminal, a drain coupled to the second terminal, and a gate coupled to receive a second control signal complimentary to the first control signal.

9. A digital to analog converter for converting a digital signal into an analog signal according to claim 5 wherein the switched current paths comprise:

control signal generating means for providing a plurality of first control signals in dependence upon bits from the n-bit digital input signal and a plurality of second control signals being substantially complimentary control signals to the first control signals;

a first transistor having a source coupled to the current terminal, a drain coupled to the output terminal, and a gate coupled to receive a transistor control signal from the first control signals; and, a second transistor having a source coupled to the current terminal, a drain coupled to the second terminal, and a gate coupled to receive a control signal from the second control signals that is substantially complimentary to the transistor control signal.

10. A digital to analog converter for converting a digital signal into an analog signal according to claim 3 comprising:

a current mode scale-up means for receiving some of the n-bit digital input signal and for receiving current from the power supply terminal and for providing multiple-current components to the output terminal in dependence upon the some of the n-bit digital input signal, each of the multiple-current components being a multiple of the reference current, whereby when current is applied, the fractional current components and multiple-current components combine to form an analog output signal.

11. A digital to analog converter for converting a digital signal into an analog signal according to claim 4 comprising:

a plurality of intermediate terminals;

a second terminal, and a current mode scale-up means comprising:

a plurality of transistors, each transistor having a source coupled to the power supply terminal, a drain coupled to one of the plurality of intermediate terminals, and a gate coupled to receive the bias voltage, the plurality of transistors for causing multiples of the reference current to flow from the power supply terminal into the plurality of intermediate terminals; and, a plurality of transistor pairs, each pair comprising:

a first transistor having a source coupled to the an intermediate terminal from the plurality of intermediate terminals, a drain coupled to the output terminal, and a gate coupled to receive a first control signal in dependence upon a bit from the n-bit digital input signal; and, a second transistor having a source coupled to the intermediate terminal, a drain coupled to the second terminal, and a gate coupled to receive a second control signal complimentary to the first control signal.

12. A digital to analog converter for converting a digital signal into an analog signal according to claim 4 comprising:

a plurality of intermediate terminals;

a second terminal, and a current mode scale-up means comprising:

a plurality of transistors, each transistor having a source coupled to the power supply terminal, a drain coupled to one of the plurality of intermediate terminals, and a gate coupled to receive the bias voltage, the plurality of transistors for causing multiples of the reference current to flow from the power supply terminal into the plurality of intermediate terminals; and, a plurality of transistor pairs, each pair comprising:

control signal generating means for providing a plurality of first control signals in dependence upon bits from the n-bit digital input signal and a plurality of second control signals being substantially complimentary control signals to the first control signals;

a first transistor having a source coupled to the an intermediate terminal from the plurality of intermediate terminals, a drain coupled to the output terminal, and a gate coupled to receive a transistor control signal from the first control signals; and, a second transistor having a source coupled to the intermediate terminal, a drain coupled to the second terminal, and a gate coupled to receive a control signal from the second control signals that is substantially complimentary to the transistor control signal.

13. A digital to analog converter for converting a digital signal into an analog signal according to claim 3 wherein all transistors used in the current mode scale-down means are of PMOS conductivity type.

14. A digital to analog converter for converting a digital signal into an analog signal according to claim 10 wherein all transistors used in the current mode scale-up means and in the current mode scale-up means are of PMOS conductivity type.

15. A digital to analog converter for converting a digital signal into an analog signal according to claim 3 comprising a second terminal, and wherein the current mode scale-down means for receiving and dividing the reference current into a plurality of fractional current components, for receiving a signal in dependence upon the n-bit digital input signal, and for providing a number of the fractional current components to the output terminal in dependence upon the n-bit digital input signal, is for dividing the reference current into $2^n$ equal fractional current components, for providing one fractional current component to the second terminal, and in dependence upon a value of a bit from the n-bit digital input signal where the bit has a bit location L from 0 . . . (n−1) where n−1 is the highest order bit, and for providing $2^{(L-1)}$ fractional current components to one of the output terminal and the second terminal.

16. A digital to analog converter for converting a digital signal into an analog signal according to claim 3 comprising a second terminal, and wherein the current mode scale-down means for receiving and dividing the reference current into a plurality of fractional current components, for receiving a signal in dependence upon the n-bit digital input signal, and for providing a number of the fractional current components to the output terminal in dependence upon the n-bit digital input signal, is for dividing the reference current into $2^n-1$ equal fractional current components and in dependence upon a value of a bit from the n-bit digital input signal where the bit has a bit location L from 0 . . . (n−1) where n−1 is the highest order bit, and for providing $2^{(L-1)}$ fractional current components to one of the output terminal and the second terminal.

17. A digital-to-analog converter for converting a digital signal into an analog signal, the converter comprising:

an output port;

a first conductor;

a plurality of other conductors;

a first means for providing a reference current to the first conductor and a plurality of means for providing multiples of the reference current to the plurality of other conductors;

current mode scale-down means coupled to the first conductor for selectively directing a fractional portion of the reference current less than the whole from the first conductor to the output port in dependence upon the digital signal; and, current mode scale-up means coupled to the plurality of other conductors for selectively directing the multiples of the reference current to the output port in dependence upon the digital signal, wherein when current is applied, the fractional portion of the reference current directed to the output port and the multiples of the reference current directed to the output port combine to form an analog output signal.

18. A digital to analog converter according to claim 17 further comprising:

a voltage bias generator for generating a bias voltage, wherein the first means is for receiving the bias voltage and, in dependence thereon for providing a reference current to the first conductor, and the plurality of means are for receiving the bias voltage and, in dependence thereon for providing multiples of the reference current to the plurality of other conductors.

19. A digital to analog converter for converting a digital signal into an analog signal according to claim 18 further comprising:

a second output port, and wherein the current mode scale-down means is coupled to the output port and to the second output port and comprises a plurality of switching means disposed in parallel, each switching means for selectively switching the current therethrough to one of the output port and the second output port.

20. A digital to analog converter according to claim 18 further comprising a second output port; and, wherein the current mode scale-down means comprises:
a transistor having a source coupled to the first conductor and a drain coupled to the second output port for directing a fixed fractional portion of the reference current toward the second output port; and,
a first plurality of transistor pairs, a source from each transistor coupled to the first conductor, a drain of one of the transistors from each transistor pair coupled to the output port and a drain of the other transistor from each transistor pair coupled to the second output port, the transistors switched in dependence upon a signal provided to the gate of one transistor within a pair and a same signal having an opposite polarity provided to the gate of another transistor within the pair.

21. A digital to analog converter according to claim 20 wherein each transistor pair comprises two transistors of the same conductivity type.

22. A digital to analog converter for converting a digital signal into an analog signal according to claim 21 wherein a transistor from a transistor pair comprises a plurality of parallel transistors having like terminals coupled together.

23. A digital to analog converter for converting a digital signal into an analog signal according to claim 18 comprising:

a second output port; and, wherein the current mode scale-up means are coupled between the other conductors, the output port, and the second output port and comprise switching means for selectively switching current to one of the output port and the second output port in dependence upon the digital signal.

24. A digital to analog converter for converting a digital signal into an analog signal according to claim 17 wherein the reference current is substantially constant.

25. A digital to analog converter for converting a digital signal into an analog signal according to claim 18 wherein all transistors used in the current mode scale-down means and in the current mode scale-up means are of PMOS conductivity type.

26. A digital to analog converter for converting an n-bit digital input signal, where n is an integer, into an analog output signal comprising:

a power supply terminal for receiving current;

a first output terminal;

a second output terminal;

a reference current terminal;

a plurality of multiple-current terminals;

a biasing means for providing a bias voltage;

a current switch for providing current from the power supply terminal to the reference current terminal in dependence upon the bias voltage;

a plurality of multiple-current switches for providing current in exponential multiples of the reference current from the power supply terminal to the multiple-current terminals in dependence upon the bias voltage;

current scale-down means for receiving m bits, where m is an integer less than n, comprising:
  a plurality of scale-down switching means, each coupled to the first output terminal, the second output terminal, and the reference current terminal and for switching a fraction of the reference current to one of the first output terminal and the second output terminal in dependence upon a bit from the m bits; and, current scale-up means for receiving n minus m bits comprising:
  a plurality of scale-up switching means, each coupled to a multiple-current terminal from the plurality of multiple-current terminals, the first output terminal and the second output terminal and for switching the current in from Said multiple-current terminal to one of the first output terminal and the second output terminal in dependence upon a bit from the n minus m bits.

27. A digital to analog converter for converting an n-bit digital input signal, where n is an integer, into an analog output signal according to claim 26 wherein each bit of the m bits is identified by a location L, where L is an integer having a value from 1 to m, and wherein $2^{(L-1)}$ scale-down current paths are switched between the first output terminal and the second output terminal in dependence upon a bit at location L.

28. A digital to analog converter for converting an n-bit digital input signal, where n is an integer, into an analog output signal according to claim 26 wherein a switching means connected in an unswitched fashion is coupled between the reference current terminal and the second output terminal for providing a fixed fractional current component to the second output port.

* * * * *